(12) United States Patent
Chen et al.

(10) Patent No.: US 6,720,619 B1
(45) Date of Patent: Apr. 13, 2004

(54) SEMICONDUCTOR-ON-INSULATOR CHIP INCORPORATING PARTIALLY-DEPLETED, FULLY-DEPLETED, AND MULTIPLE-GATE DEVICES

(75) Inventors: Hao-Yu Chen, Kaoshiung (TW);
Yee-Chia Yeo, Albany, CA (US);
Fu-Liang Yang, Hsin-Chu (TW);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/319,119

(22) Filed: Dec. 13, 2002

(51) Int. Cl.$^7$ .............................................. H01L 27/148
(52) U.S. Cl. ........................................ 257/347; 257/623
(58) Field of Search ................................ 257/347, 623, 257/618; 438/164

(56) References Cited

U.S. PATENT DOCUMENTS

| | | |
|---|---|---|
| 4,946,799 A | 8/1990 | Blake et al. |
| 6,222,234 B1 | 4/2001 | Imai |
| 6,387,739 B1 | 5/2002 | Smith, III |
| 6,413,802 B1 | 7/2002 | Hu et al. |
| 6,642,090 B1 * | 11/2003 | Fried et al. ............ 438/164 |

OTHER PUBLICATIONS

S.K.H. Fung, et al., "Gate Length Scaling to 30nm Regime Using Ultra–thin Film PD–SOI Technology", International Electron Device Meeting 2001, Technical Digest, pp. 629–632.

W. Chen, et al., "Suppression of the SOI Floating–body Effects by Linked–body Device Structure", 1996 Symposium on VLSI Technology, Digest of Technical Papers, pp. 92–93.

M. Celik et al., "A 45 nm Gate Length High Performance SOI Transistor for 100nm CMOS Technology Applications", 2002 Symposium on VLSI Technology, Digest of Technical Papers, pp. 166–167.

R. Chau et al., "A 50 nm Depleted–substrate CMOS Transistor (DST)", International Electron Device Meeting 2001, Technical Digest, pp. 621–624.

G. G. Shahidi, "SOI Technology for GHz Era", IBM Journal of Research & Development, vol. 46, pp. 121–131, 2002.

* cited by examiner

Primary Examiner—Douglas Wille
(74) Attorney, Agent, or Firm—Haynes and Boone, LLP (57) ABSTRACT

The present disclosure provides a system and method for forming device on an insulator material. First, a semiconductor depletion material is formed with a predetermined height and width overlying a predetermined portion of the substrate to from an active region. An isolation material formed on top of the substrate surrounding the active region so as to bury a bottom portion of the active region therein, thereby exposing a top portion of the active region. A gate dielectric layer is deposited for covering the exposed the top and two sidewalls of the top portion of the active region, and at least one gate electrode is then formed on top of the gate dielectric layer and extending through two sidewalls thereof to reach the isolation material.

16 Claims, 6 Drawing Sheets

(a) Conventional PD-SOI with $W/L_g = 5$ μm/0.065 μm.

(b) FD-SOI with $W/L_g = 5$ μm/10 μm.

(c) FinFET-like FD-SOI with $W/L_g = 0.065$ μm/0.065 μm.

SEMICONDUCTOR-ON-INSULATOR CHIP INCORPORATING PARTIALLY-DEPLETED, FULLY-DEPLETED, AND MULTIPLE-GATE DEVICES

BACKGROUND

The present disclosure relates generally to the fabrication of semiconductor devices, and more particularly, to semiconductor-on-insulator chips incorporating partially-depleted, fully-depleted, and multiple-gate devices.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 $\mu$m and even 90 nm feature sizes.

The desire for higher performance circuits has driven the development of high-speed sub-100 nanometer (nm) silicon-on-insulator (SOI) complementary metal-oxide- semiconductor (CMOS) technology. In SOI technology, metal-oxide semiconductor field-effect transistors (MOSFETs) are formed on a thin layer of silicon overlying a layer of insulating material such as silicon oxide. Devices formed on SOI offer many advantages over their bulk counterparts, including reduced junction capacitance, absence of reverse body effect, soft-error immunity, full dielectric isolation, and absence of latch-up. SOI technology therefore enables higher speed performance, higher packing density, and reduced power consumption.

There are two types of SOI devices: partially-depleted SOI (PD-SOI) devices, and fully-depleted (FD-SOI) devices. A PD-SOI MOSFET is one in which the body thickness is thicker than the maximum depletion layer width $W_{d,max}$, and a FD-SOI MOSFET is one in which the body thickness is thinner than $W_{d,max}$.

It is noticed that remarkable progress has recently been achieved in PD-SOI technology. Although PD-SOI devices have the merit of being highly manufacturable, significant design burden is faced by its users because of floating body effects. In PD-SOI devices, charge carriers generated by impact ionization near the drain/source region accumulate near the source/drain region of the transistor. When sufficient carriers accumulate in the floating body, which is formed right below the channel region, the body potential is effectively altered. Floating body effects occur in PD-SOI devices because of charge build-up in the floating body region. This results in kinks in the device current-voltage (I-V) curves, thereby degrading the electrical performance of the circuit. In general, the body potential of a PD-SOI device may vary during static, dynamic, or transient device operation, and is a function of many factors like temperature, voltage, circuit topology, and switching history. Therefore, circuit design using PD-SOI devices is not straightforward, and there is a significant barrier for the adoption of PD-SOI technology or the migration from bulk-Si design to PD-SOI design.

One traditional way to suppress floating body effects in PD-SOI devices is to provide an extra electrical connection by adding a contact to the body for collection of current due to impact ionization. Various methods of making a contact to the body of a SOI transistor are known, but various disadvantages are known to be associated with these methods. One method for the suppression of the SOI floating-body effects is to use a linked-body device structure. However, the method is limited by a high body contact resistance. Blake et al., in U.S. Pat. No. 4,946,799, described a process for making a body node to source node connection, where a contact region of the same conductivity type as the body node is formed within the source region in a self-aligned fashion, thus eliminating the floating body effects. However, the method of Blake et al. results in a reduced amount of current that can only be handled for a given transistor width. In U.S. Pat. No. 6,387,739 issued to G. E. Smith III et al, a method for forming a body contact structure for SOI transistor is described. This method, however, takes up an additional amount of space or layout area.

Another way of avoiding floating body effects in SOI devices is to adopt a fully-depleted SOI (FD-SOI) technology. FD-SOI devices do not suffer from floating-body effects due to the fact that the body is fully-depleted. FD-SOI technology is therefore design-friendly since floating-body effects need not be accounted for in circuit design. In a FD-SOI technology, devices with a low body-doping and/or a thin body thickness are used. For good control of short-channel effects in ultra-scaled devices, the device body thickness is usually reduced to less than one third of gate length. Such a thin body thickness would require raised source/drain technology for series resistance reduction. However, raised source/drain formation, currently performed by selective epitaxy, is immature, expensive, pattern-density dependent, and may result in reduced manufacturing yield. In addition, SOI substrates with uniform ultra-thin Si films, as required for the manufacture of FD-SOI devices with ultra-thin body, is currently unavailable.

What is needed is a method and system to overcome the shortcomings of the prior art, and to provide a highly manufacturable PD-SOI-like technology that produces FD-SOI type devices to eliminate floating body effects.

SUMMARY

The present disclosure provides a system and method for forming devices on an insulator material. First, a semiconductor depletion material is formed with a predetermined height and width overlying a predetermined portion of the substrate to form an active region. An isolation material formed on top of the substrate surrounding the active region so as to bury a bottom portion of the active region therein, thereby exposing a top portion of the active region. A gate dielectric layer is deposited for covering the exposed the top and two sidewalls of the top portion of the active region, and at least one gate electrode is then formed on top of the gate dielectric layer and extending through two sidewalls thereof to reach the isolation material.

In one example, a silicon-on-insulator (SOI) chip is formed with a silicon layer of a predetermined thickness overlying an insulator layer at a predetermined location. A fully-depleted SOI (FD-SOI) device is formed on a first portion of the semiconductor layer using a partially depleted SOI (PD-SOI) technology based process, wherein an active region of the FD-SOI device is isolated and has two top round edges. On the same silicon layer, a partially-depleted SOI (PD-SOI) device is also formed on a second portion of the silicon layer.

BRIEF DESCRIPTION OF THE DRAWINGS

FIGS. 1(a) and (b) illustrate a partially depleted SOI device and a fully depleted SOI device.

FIGS. 1(c) and (d) illustrate a method for forming FD-SOI device according to one example of the present disclosure.

DETAILED DESCRIPTION OF THE PREFERRED EMBODIMENTS

The present invention provides a method and system to overcome the shortcomings of the prior art, and to provide a highly manufacturable PD-SOI-like technology that produces FD-SOI type devices and multiple-gate or FinFET-like devices to eliminate floating body effects.

A new semiconductor-on-insulator chip and method of manufacture is to be described below. Using a specific example to describe the invention, it is illustrated that the semiconductor is silicon, but the present invention is not limited to silicon-on-insulator chips, and the same concept may be applied to silicon-germanium-on-insulator (SGOI) chips, or any chips based on a semiconductor material such as gallium arsenide and indium phosphide overlying an insulator (e.g., silicon oxide, aluminum oxide, and silicon nitride, etc.).

U.S. Pat. No. 6,222,234, issued to K. Imai, describes a method for the fabrication of FD-SOI and PD-SOI devices on the same substrate. A SOI substrate with two different silicon film thicknesses is provided, where the FD-SOI devices reside in a region with a thinner silicon film, and the PD-SOI devices reside in a region with a thicker silicon film. Since the approach described by K. Imai employs thin silicon films for the fabrication of FD-SOI devices, it does not avoid the manufacturing problems of FD-SOI devices, e.g. problems in high series resistance, difficulty of forming raised source/drain structures.

In the present disclosure, a new technology is disclosed for implementing FD-SOI devices not by reducing the silicon body thickness, but by rearranging the planar transistor geometry, channel length, or channel width. The present invention produces the FD-SOI devices on a silicon layer having a thickness in the range of 10 angstroms to 2000 angstroms. The new method maintains the manufacturing simplicity of the PD-SOI technology, and benefits from FD-SOI's and FinFET's immunity to floating-body effects, thus greatly lowering the design and manufacturing entry barrier for SOI technology.

A sample transistor fabricated with partially-depleted 90 nm SOI technology according to one example of the present invention may have SIMOX wafers as its substrate with a buried oxide thickness of about 1200 Å. The partially depleted transistor is processed on an about 600 Å thick silicon film. Shallow trench isolation (STI) dielectrically isolates transistors. A polysilicon gate is deposited after the thermal growth of a gate dielectric about 16.5 Å thick. The gate dielectric may also be made of a high permittivity material with permittivity larger than 5, such as aluminum oxide $Al_2O_3$, hafnium oxide $HfO_2$, zirconium oxide $ZrO_2$, or silicon oxynitride SiON. In addition, cobalt salicidation can be used for reduced source/drain and gate resistance.

A super-halo structure is employed to control short-channel effects without significant increase in parasitic junction capacitance. The use of a super-halo implant and light body doping allows the achievement of FD-SOI and PD-SOI devices at different gate lengths.

Figure 1:
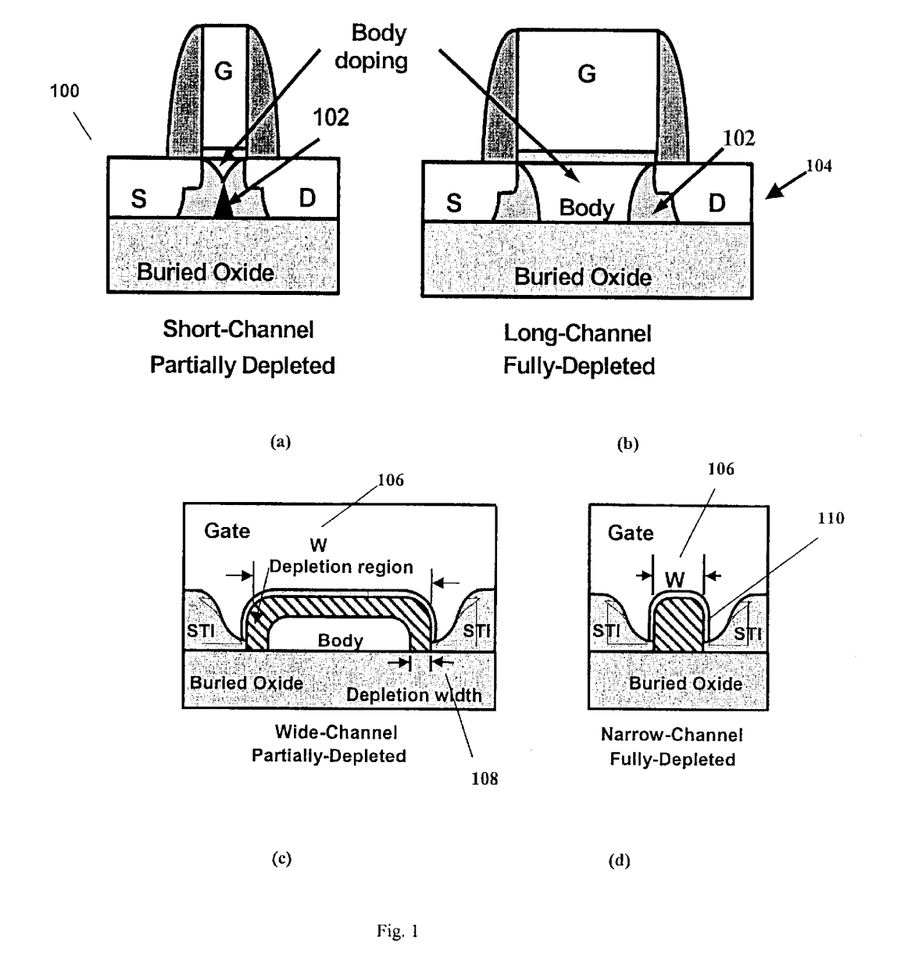

FIGS. 1(a) and (b) show the transition from partial to full depletion of the SOI device body as the gate length is increased and as the effective body doping is reduced. In a short-channel device 100, the high body doping concentration due to the halo doping 102 limits the depletion width in the body to be less than the silicon film thickness, and the device is therefore partially-depleted. In a long-channel device 104, the body doping concentration is low, and therefore the device is fully-depleted.

FIGS. 1(c) and (d) illustrate another way in which FD-SOI device may be obtained by reducing the device gate width (or simply, device width) W 106. In FIG. 1(c), the gate width 106 is much bigger than the depletion layer width $W_{d,max}$ 108. When the gate width 106 is reduced to less than twice of the maximum depletion layer width 108 in the body, as shown in FIG. 1(d), the gate field 110 encroaches from the isolation edges and eliminates the body, thereby making the device fully-depleted. The resulting FD-SOI device as shown in FIG. 1(d) is a multiple-gate device, and is similar to a double-gate FinFET. As such, a silicon-on-insulator (SOI) chip may have a partially depleted SOI (PD-SOI) MOSFET and a fully-depleted SOI (FD-SOI) MOSFET formed a semiconductor layer at different locations, wherein the PD-SOI MOSFET and FD-SOI MOSFET are fabricated using a PD-SOI technology based process as described above.

Figure 2:
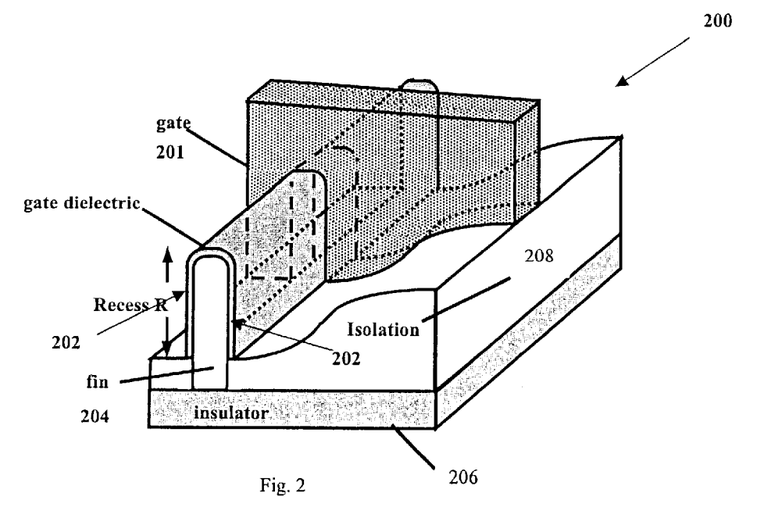
FIG. 2 illustrates a three dimensional view of an SOI device according to one example of the present disclosure.

FIG. 2 illustrates a three-dimensional view of a multiple-gate device 200. The multiple-gate transistor 200 has a gate electrode 201 on top of a gate dielectric layer 202 covering the two sidewalls as well as the top of a "fin" like active or depletion region 204. As illustrated, on top of the insulator layer 206, a depletion material layer is first established, which has its predetermined height and width to form the fin like active region 204, and which in turn determines the height of the intentional isolation recess (which will be further described below). An isolation layer 208 is deposited to surround or bury a bottom portion of the active region 204 therein, leaving a top portion of the active region exposed. A gate dielectric layer 202 is then deposited and, like a blanket, covers the top and the sidewalls of the fin like active region 204. The gate dielectric layer can have a thickness between 3 to 100 angstroms. The gate dielectric layer on top of the active region 204 can have a different thickness than the gate dielectric layer on the two sidewalls. In another example, the thickness of the gate dielectric layer on the top is thinner than that on the sidewall. In some examples, the thickness of the gate dielectric layer 202 on top of the active region 204 is less than 20 angstroms. With the gate dielectric layer appropriately formed, the gate electrode 201 can then be deposited selectively on top of the gate dielectric layer 202. One or more gate electrodes can be used to form multiple-gate devices. The gate electrode 201 can be formed by conventional poly-crystalline silicon, poly-crystalline silicon germanium, as well as selective metals.

The portions of the fin-like active region on both sides of the gate can be processed to be the source and drain regions. The source and drain regions of the device can be lightly doped, or may include an extension region. The source and drain regions can be strapped with one or more conductive materials such as metals and silicides. The conductive materials can reach the source and drain regions through contacts on the sidewalls or the top of the fin like active region.

Figure 3:
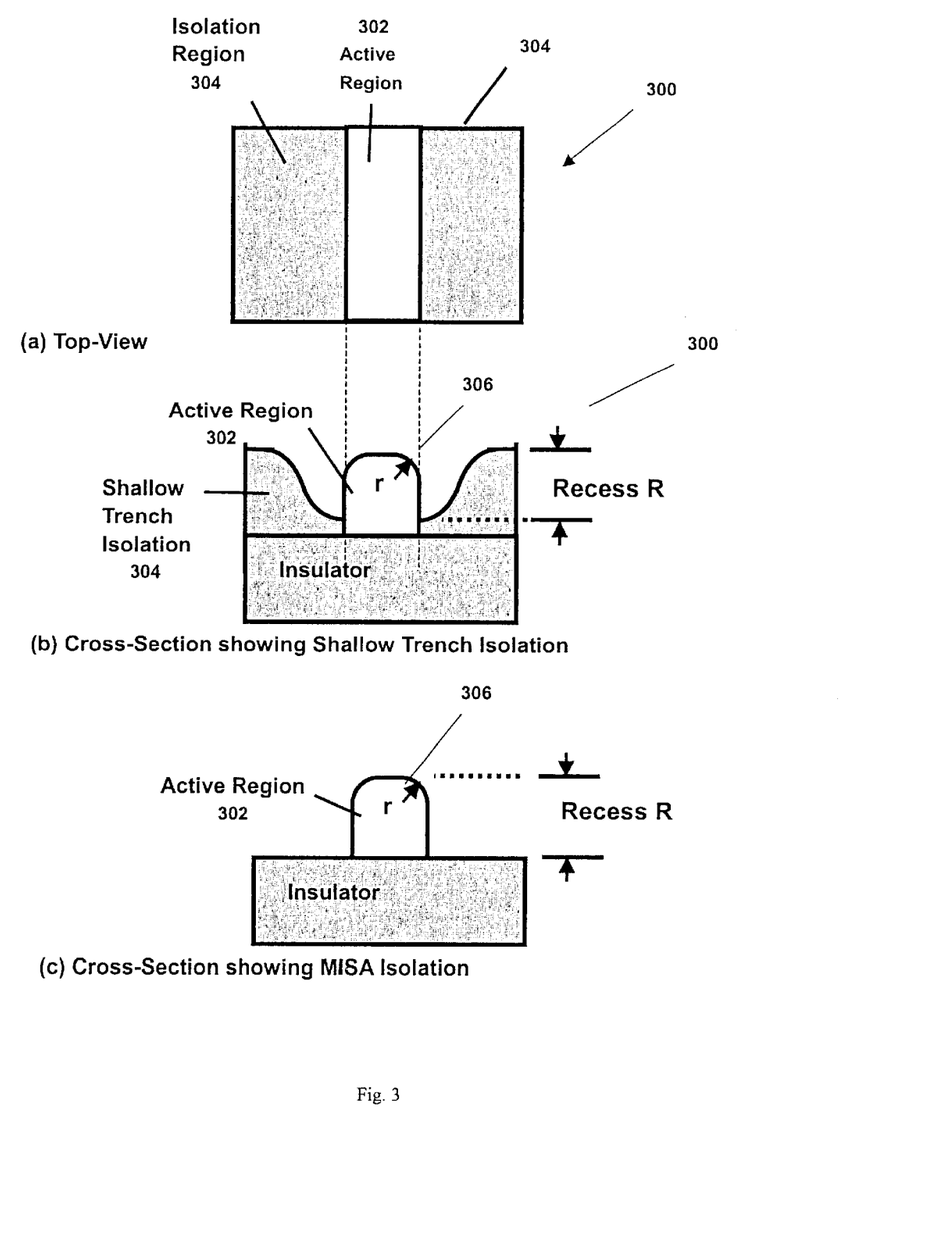
FIGS. 3(a)–(c) illustrate cross sections of an SOI device.

A corner rounding at the isolation edge of the active region of the FD-SOI MOSFET is another feature of the present invention to avoid double-hump $I_{GS}$–$V_{GS}$ characteristics. According to one embodiment, FIG. 3(a) shows the top view of a device with the substrate 300 after the patterning of an active region 302 surrounded by isolation regions 304. The sectional view of the device 300 is illustrated in FIG. 3(b), in which the isolation region 304 is depicted as a shallow trench isolation. In another embodiment, as shown in FIG. 3(c), a MESA isolation structure is used for isolation purposes. MESA is a widely used isolation technique for ultra thin film SOI MOSFET due to the advantages of high integration densities and process simplicity. The cross-sections in FIGS. 3(b) and (c) emphasize the rounded corners 306 in the edge portions of the active region 302 adjacent to the isolation regions. The radius of curvature of the round corner 306 is denoted by r. The value of r may vary from 10 angstroms to 200 angstroms. Corner rounding of the active silicon region 302 may be achieved by processes such as etching, oxidation, and/or annealing, performed after the active region definition. It is understood that the round corner in the sectional view are in fact two round top edges of the active region in a three dimensional view.

FIGS. 3(b) and (c) schematically illustrate an intentional isolation recess according to one example of the present invention. The recess R in both a shallow trench isolation or a MESA isolation is designed to be sufficiently large to allow the gate to deplete the narrow body from the isolation edges. In addition, the intentional recess will also give extra extended channel width. The value of R is preferably greater than 300 angstroms. In general, R may even be greater than the thickness of the active silicon film thickness.

Figure 4:
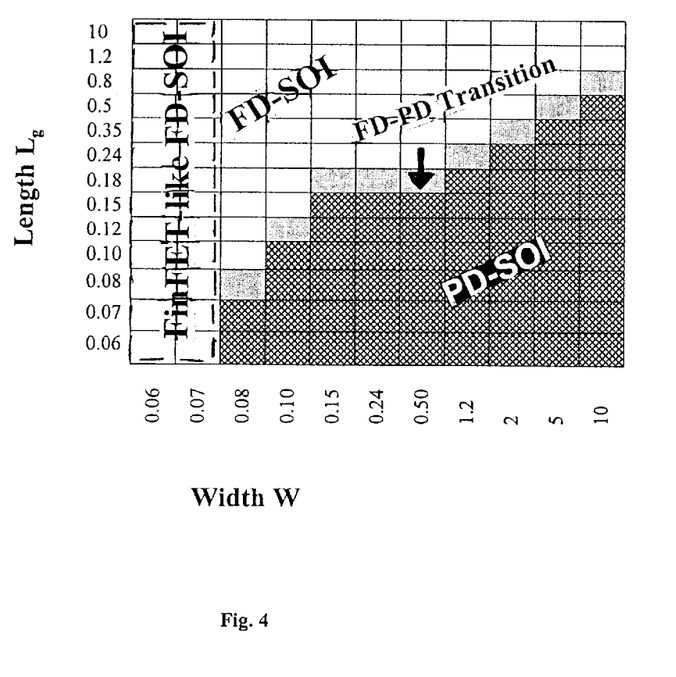
FIG. 4 illustrates a distribution of the PD-SOI and FD-SOI NMOS devices according to the device width and length.

FIG. 4 illustrates a distribution of the PD-SOI and FD-SOI NMOS devices according to the device width and length. As shown, FinFET-like devices are obtained at small device widths, and the PD-SOI region for PMOSFETs is much smaller than those for NMOSFETs because impact ionization induced parasitic bipolar action is alleviated in PMOS devices.

Figure 5:
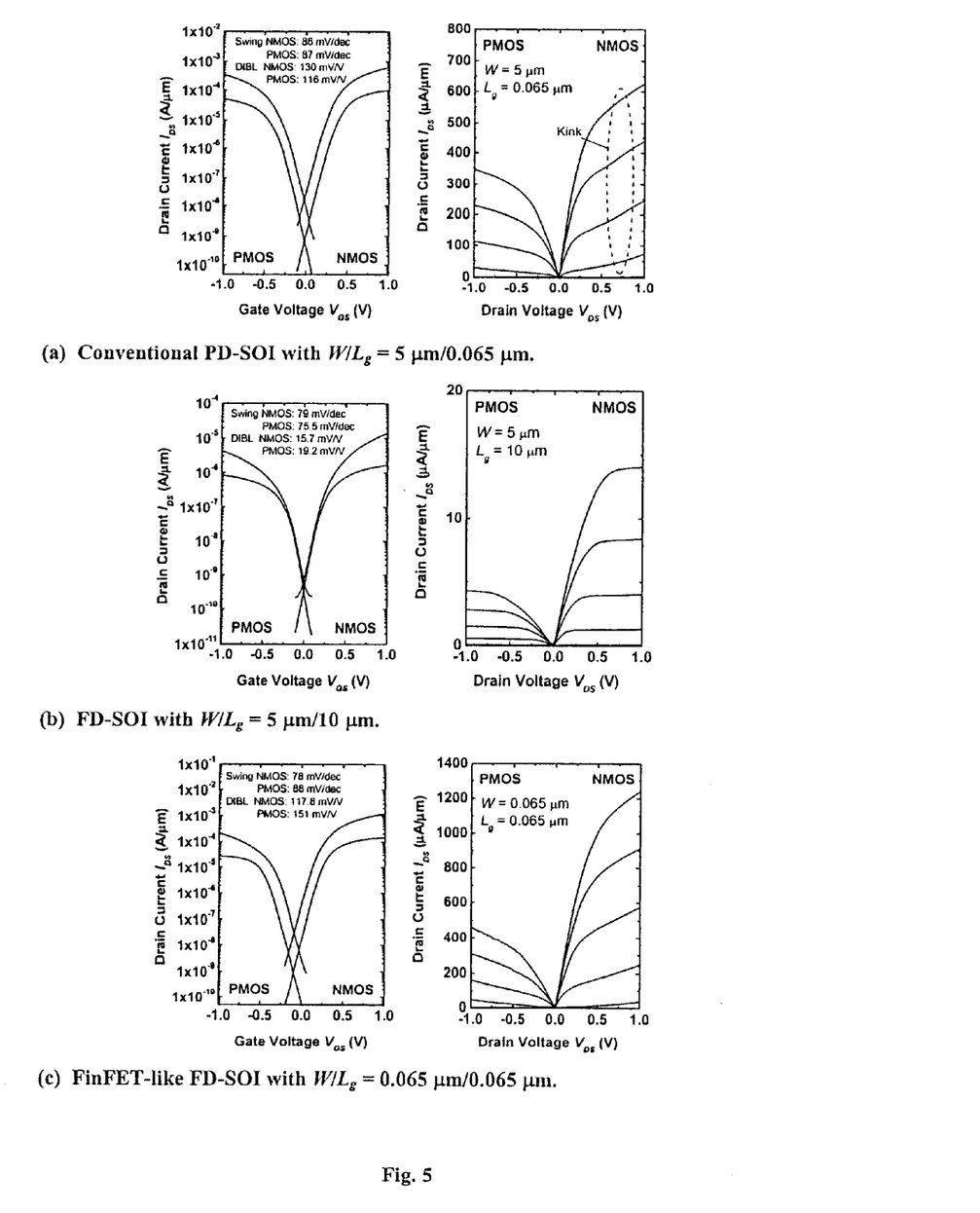
FIGS. 5(a)–(c) illustrate the subthreshold characteristics and turn-on behavior in SOI NMOS and PMOS transistors device.

FIGS. 5(a)–(c) show the subthreshold characteristics and turn-on behavior in SOI NMOS and PMOS transistors with various combinations of W and $L_g$. The data have not yet been corrected for self-heating effects. In FIG. 5(a), the saturation drain currents $I_{Dsat}$, for PD-SOI NMOS and PMOS devices are 630 $\mu A/\mu m$ and 350 $\mu A/\mu m$ at a supply voltage $V_{DD}$ of 1.0 V and an $I_{off}$ of 20 nA/$\mu m$. The kink in the $V_{DS}$–$I_{DS}$ characteristics of FIG. (a) is evident. As $L_g$ is increased to 10 $\mu m$, as shown in FIG. 5(b), the device characteristics enter the FD-SOI region of FIG. 4, and the kink in the $I_{DS}$–$V_{DS}$ curve disappears. The transition from PD-SOI to FD-SOI also occurs as the width is reduced from 5 $\mu m$ to 0.065 $\mu m$ (as shown from FIG. 5(a) to FIG. 5(c)). FIG. 5(c) illustrates the electrical characteristics of FinFET-like FD-SOI transistors. Excellent drive currents of 1250 $\mu A/\mu m$ and 480 $\mu A/\mu m$ are obtained for the N-MOS and P-MOS transistors, respectively, much higher than those for devices with W/$L_g$=5 $\mu m$/0.065 $\mu m$ shown in FIG. 5(a). One reason for the enhanced $I_{Dsat}$ is the improvement in the subthreshold swing $S_{th}$.

Figure 6:
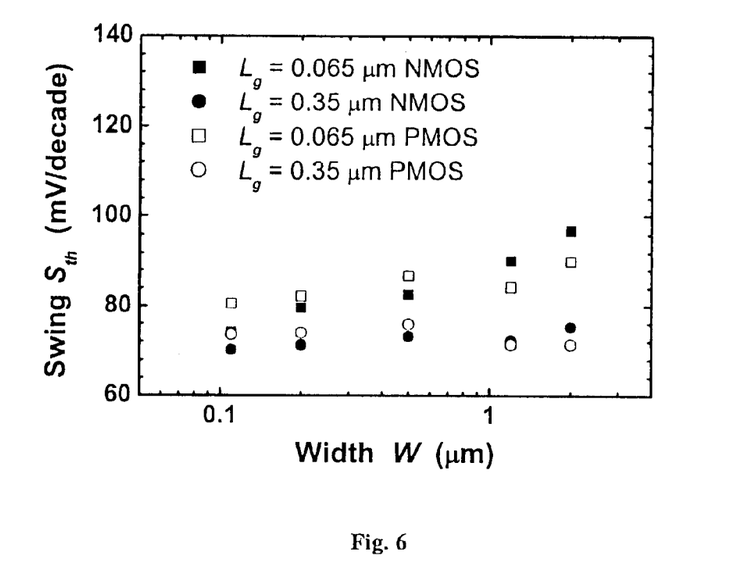
FIG. 6 is a chart showing reduction of subthreshold swing with a reduction in width for both NMOS and PMOS devices.
Figure 7:
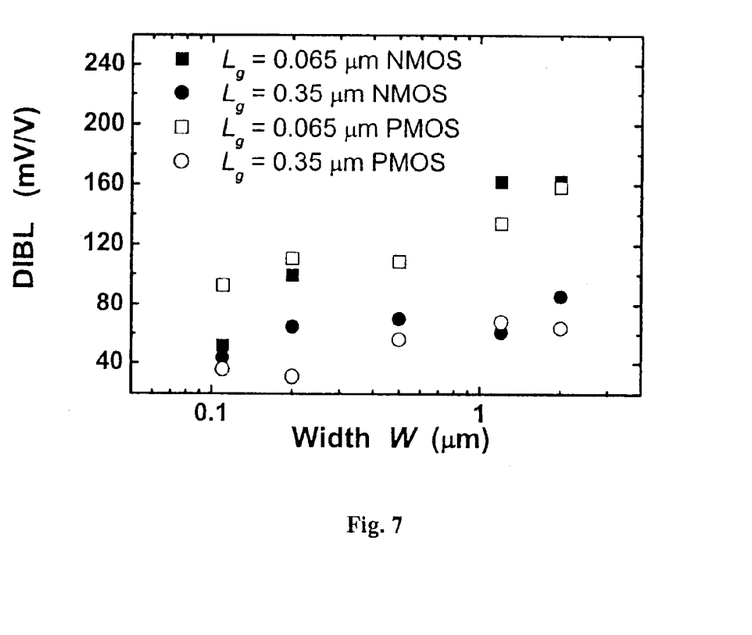
FIG. 7 is a chart showing improvements in the drain-induced barrier lowering with a reduction in width for both NMOS and PMOS devices.

FIG. 6 shows the reduction of $S_{th}$ with a reduction in width for both NMOS and PMOS devices. In FIG. 7, a similar improvement trend in the drain-induced barrier lowering (DIBL) is observed. This is consistent with double-gate FinFET showing better subthreshold swing and DIBL. Another reason for the excellent $I_{Dsat}$ in FIG. 5(c) is the extra extended channel width in the FinFET-like devices.

In summary, the present invention is a preferred improvement over PD-SOI or FD-SOI technologies. The present invention can selectively combine the advantages of PD-SOI and FD-SOI. For example, when converting circuit design from bulk to SOI, this invention can achieve minimal floating body effects at critical circuits like analog circuits using FD-SOI devices, and can also have the freedom to adopt multiple $V_t$ devices in the PD-SOI region. Another noticeable improvement of the present invention is its introduction of double-gate FinFET-like devices, which obviously benefit scalability and control of short-channel effects. The semiconductor technology disclosed herein may be referred to as FinFET/FD inside PD-SOI ("FIP-SOI").

A more detailed comparison with PD-SOI and FD-SOI technologies is illustrated below in Table I, wherein one "plus" sign indicates a "acceptable" status of the feature and two "plus" signs indicate a "good" status, all of which are just relative measurements.

|  | PD-SOI | FD-SOI | FIP-SOI |
| --- | --- | --- | --- |
| Manufacturability | ++ |  | ++ |
| Body thickness fluctuation immunity | ++ |  | ++ |
| Multiple $V_t$ | ++ |  | ++ |
| History effects |  | ++ | ++ |
| Body effects immunity | + | ++ | ++ |
| Converting from bulk design |  | + | ++ |
| Short channel effects | + |  | ++ |
| Scalability | + |  | ++ |
| Subthreshold swing |  | ++ | ++ |
| Extra extended channel width |  |  | ++ |
| Additional body contact design | Must | No need | No Need |

As seen above, the disclosed FIP-SOI technology offers a simple way to reap the design-friendliness benefits of FD-SOI and FinFETs. As the future transistor features are further scaled down, both the silicon body thickness and the minimum device width will be decreased. As such, the FD-SOI and FinFET-like devices will play increasingly larger roles, and the FIP-SOI technology could speed up the introduction of the FinFET technology.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention.

It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A multiple-gate device structure, comprising:
   a substrate;
   a semiconductor depletion material with a first predetermined height and width overlying a predetermined portion of the substrate to form an active region;

an isolation material formed on top of the substrate surrounding the active region so as to bury a bottom portion of the active region therein, thereby exposing a top portion of the active region;

a gate dielectric layer covering the exposed portion of the top and two sidewalls of the top portion of the active region; and at least one gate electrode formed on top of the gate dielectric layer and extending through two sidewalls thereof to reach the isolation material, wherein source and drain regions of the multiple-gate device are separated by the gate electrode, wherein the exposed top portion of the active region has its top corners rounded.

2. The structure of claim 1 wherein the substrate is an insulation material.

3. The structure of claim 1 where the gate dielectric layer comprises silicon oxynitride.

4. The structure of claim 1 wherein the gate dielectric layer comprises high permittivity materials.

5. The structure of claim 4 wherein the relative permittivity is greater than 5.

6. The structure of claim 4 wherein the gate dielectric layer comprises $Al_2O_3$, $HfO_2$, or $ZrO_2$.

7. The structure of claim 1 wherein the gate dielectric layer has a thickness of between 3 and 100 angstroms.

8. The structure of claim 1 wherein the thickness of the gate dielectric layer on the top of the active region is different from the thickness of the gate dielectric layer on the sidewall of the active region.

9. The structure of claim 8 wherein the thickness of the gate dielectric layer on the top of the active region is thinner than the thickness thereof on the sidewall.

10. The structure of claim 1 wherein the thickness of the gate dielectric layer on the top of the active region is less than 20 angstroms.

11. The structure of claim 1 wherein the gate electrode comprises polycrystalline silicon.

12. The structure of claim 1 wherein the gate electrode comprises poly-crystalline silicon germanium.

13. The structure of claim 1 wherein the gate electrode comprises a metal.

14. The structure of claim 1 wherein the source and drain regions each includes a lightly doped or extension region.

15. The structure of claim 1 wherein the source and drain regions are strapped by one or more conductive materials such as metals and silicides.

16. The structure of claim 15 further comprises contacts between the conductive materials and the source and drain regions on the sidewalls and/or top of the active region.

* * * * *